(12) United States Patent
Sun et al.

(10) Patent No.: US 10,890,493 B2
(45) Date of Patent: Jan. 12, 2021

(54) SYSTEMS AND METHODS FOR MEASURING TRANSISTOR JUNCTION TEMPERATURE WHILE OPERATING

(71) Applicant: Infineon Technologies AG, Neubiberg (DE)

(72) Inventors: Hui Bo Sun, Beijing (CN); Jia Zhao, Beijing (CN)

(73) Assignee: Infineon Technologies AG

( * ) Notice: Subject to any disclaimer, the term of this patent is extended or adjusted under 35 U.S.C. 154(b) by 254 days.

(21) Appl. No.: 15/896,289

(22) Filed: Feb. 14, 2018

(65) Prior Publication Data

US 2019/0250046 A1 Aug. 15, 2019

(51) Int. Cl.

| | |
|---|---|
| *H02M 7/539* | (2006.01) |
| *G01K 7/01* | (2006.01) |
| *H02M 1/08* | (2006.01) |
| *G01R 19/00* | (2006.01) |
| *G01K 13/00* | (2006.01) |
| *H02M 7/5387* | (2007.01) |
| *G01R 15/20* | (2006.01) |
| *H02M 1/00* | (2006.01) |

(Continued)

(52) U.S. Cl.
CPC .............. *G01K 7/01* (2013.01); *G01K 13/00* (2013.01); *G01R 19/0092* (2013.01); *H02M 1/08* (2013.01); *H02M 7/539* (2013.01); *H02M 7/5387* (2013.01); *G01R 15/202* (2013.01); *H02M 2001/0009* (2013.01); *H02M 2001/327* (2013.01); *H02P 27/06* (2013.01)

(58) Field of Classification Search
CPC .......... H02M 1/08; H02M 7/539; H02M 1/32; H02M 1/00; H02M 7/5387; H02M 2001/0009; H02M 2001/327

USPC ...................................... 363/95–97, 131–134
See application file for complete search history.

(56) References Cited

U.S. PATENT DOCUMENTS

| | | | | |
|---|---|---|---|---|
| 4,151,387 A | * | 4/1979 | Peters, Jr. ................ | F24C 7/02 |
| | | | | 219/623 |
| 5,500,792 A | * | 3/1996 | Jeon ................... | H02M 7/53803 |
| | | | | 315/190 |

(Continued)

OTHER PUBLICATIONS

Yuxiang Chen, et al.,"A Thermo-Sensitive Electrical Parameter With Maximum dIc/dt During Turn-Off For High Power Trench/Field-Stop IGBT Module", pp. 449-504, 978-1-4673-9550-2/16, Applied Power Electronics Conference and Exposition (APEC), IEEE, Mar. 20-24, 2016.

*Primary Examiner* — Thienvu V Tran
*Assistant Examiner* — Nusrat Quddus
(74) *Attorney, Agent, or Firm* — Design IP

(57) ABSTRACT

Systems, devices and methods are provided herein for measuring a junction temperature of a transistor. A system includes a power inverter configured to supply power to a load, the power inverter including the transistor that is configured to switch between an on-state and an off-state and generate a load current during the on-state; a current sensor configured to measure the load current; a voltage transit slope detection circuit configured to determine a voltage transit slope corresponding to a voltage across the transistor during a turn-off period of the transistor during which the transistor is in the off-state; and a processing unit configured to determine the junction temperature of the transistor based on the measured load current and the determined voltage transit slope.

20 Claims, 9 Drawing Sheets

(51) Int. Cl.
   *H02P 27/06*   (2006.01)
   *H02M 1/32*   (2007.01)

(56) References Cited

U.S. PATENT DOCUMENTS

| | | | | |
|---|---|---|---|---|
| 5,546,300 A | * | 8/1996 | Lee | H02M 7/53871 |
| | | | | 315/209 R |
| 8,760,889 B2 | * | 6/2014 | Maruyama | H03K 17/0828 |
| | | | | 361/93.8 |
| 2012/0250385 A1 | * | 10/2012 | Takihara | H02M 1/32 |
| | | | | 363/132 |
| 2013/0181723 A1 | * | 7/2013 | Mauder | G01R 19/0092 |
| | | | | 324/601 |
| 2015/0377717 A1 | * | 12/2015 | Rollin | G01K 7/01 |
| | | | | 318/400.26 |
| 2016/0356655 A1 | * | 12/2016 | Tsurumaru | H01L 29/7395 |
| 2017/0327001 A1 | * | 11/2017 | Lu | B60L 3/003 |

\* cited by examiner

FIG 2

| I_load at turn off \ Tj | 25°C | 50°C | 75°C | 100°C | 125°C |
|---|---|---|---|---|---|
| 15A | 1080V/us | 963V/us | 858V/us | 747V/us | 665V/us |
| 30A | 1515V/us | 1300V/us | 1158V/us | 1016V/us | 879V/us |
| 60A | 2139V/us | 1874V/us | 1655V/us | 1458V/us | 1293V/us |

FIG 3

› Vdc=600V

| I_load at turn off \ Tj | 25°C | 50°C | 75°C | 100°C | 125°C |
|---|---|---|---|---|---|
| 15A | 1080 | 963 | 858 | 747 | 665 |
| 30A | 1515 | 1300 | 1158 | 1016 | 879 |
| 60A | 2139 | 1874 | 1655 | 1458 | 1293 |

› Vdc=550V

| I_load at turn off \ Tj | 25°C | 50°C | 75°C | 100°C | 125°C |
|---|---|---|---|---|---|
| 15A | 1015 | 905 | 807 | 702 | 625 |
| 30A | 1424 | 1222 | 1089 | 955 | 826 |
| 60A | 2011 | 1762 | 1556 | 1371 | 1215 |

› Vdc=500V

SYSTEMS AND METHODS FOR MEASURING TRANSISTOR JUNCTION TEMPERATURE WHILE OPERATING

FIELD

The present disclosure relates generally to power inverters, and, more particularly, to measuring a junction temperature of one or more transistors while operating.

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor structure configured to conduct a load current along a load current path between two load terminal structures of the device. Further, the load current path may be controlled by means of a control electrode, sometimes referred to as gate electrode. For example, upon receiving a corresponding control signal from, e.g., a driver unit, the control electrode may set the power semiconductor device in one of a conducting state and a blocking state.

A transistor may be used to drive a load current. Detecting transistor junction temperature is important for ensuring the integrity of power semiconductor devices. If the transistor junction temperature of a transistor exceeds an upper limit, the transistor may fail. However, since transistor chips are covered by plastic shells, it is difficult to monitor junction temperature directly.

SUMMARY

Systems, devices and methods are provided herein for measure a junction temperature of a transistor.

According one or more embodiments, a system is provided that is configured to measure a junction temperature of a transistor. The system includes a power inverter configured to supply power to a load, the power inverter including the transistor that is configured to switch between an on-state and an off-state and generate a load current during the on-state; a current sensor configured to measure the load current; a voltage transit slope detection circuit configured to determine a voltage transit slope corresponding to a voltage across the transistor during a turn-off period of the transistor during which the transistor is in the off-state; and a processing unit configured to determine the junction temperature of the transistor based on the measured load current and the determined voltage transit slope.

According to another one or more embodiments, a method includes switching the transistor between an on-state and an off-state to convert a direct current (DC) voltage to an alternating current (AC) voltage; generating a load current during the on-state of the transistor; measuring the load current; determining a voltage transit slope corresponding to a voltage across the transistor during a turn-off period of the transistor during which the transistor is in the off-state; and determining the junction temperature of the transistor based on the measured load current and the determined voltage transit slope.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings:

FIG. 2 shows a look-up table according to one or more embodiments;

FIG. 3 shows a collection of look-up tables for an IGBT according to one or more embodiments;

DETAILED DESCRIPTION

Figure 1:
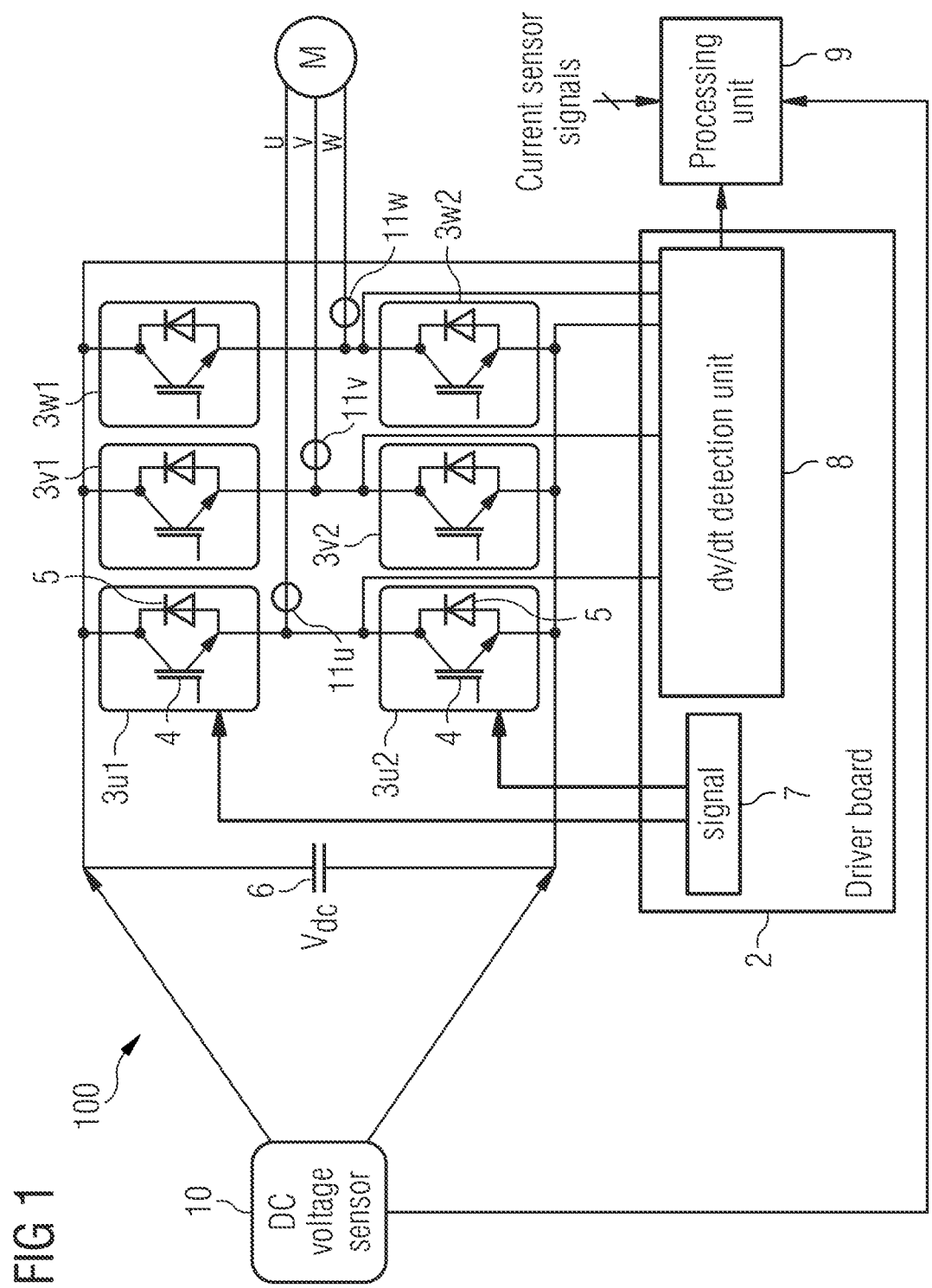
FIG. 1 is a schematic block diagram illustrating a motor control loop of a power semiconductor device according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "front", "behind", "back", "leading", "trailing", "below", "above" etc., may be used with reference to the orientation of the figures being described.

Because parts of embodiments can be positioned in a number of different orientations, the directional terminology is used for purposes of illustration and is in no way limiting. It is to be understood that other embodiments may be utilized and structural or logical changes may be made without departing from the scope defined by the claims The following detailed description, therefore, is not to be taken in a limiting sense.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The term "substantially" may be used herein to account for small manufacturing tolerances (e.g., within 5%) that are deemed acceptable in the industry without departing from the aspects of the embodiments described herein.

Embodiments may relate to sensors and sensor systems, and to obtaining information measured entity. A sensor may refer to a component which converts a physical quantity to be measured to an electric signal, for example, a current signal or a voltage signal. The physical quantity may for example comprise a magnetic field, an electric field, a current, or a voltage, but is not limited thereto. A sensor device, as described herein, may be a voltage sensor, a current sensor, and the like.

As an example, one or more embodiments one or more magnetic sensors may be a Hall-effect sensor (i.e., a Hall sensor), but is not limited thereto.

A Hall effect sensor is a transducer that varies its output voltage (Hall voltage) in response to a magnetic field. It is based on the Hall effect which makes use of the Lorentz force. The Lorentz force deflects moving charges in the presence of a magnetic field which is perpendicular to the current flow through the sensor or Hall plate. Thereby a Hall plate can be a thin piece of semiconductor or metal. The deflection causes a charge separation which causes a Hall electrical field. This electrical field acts on the charge in the opposite direction with regard to the Lorentz Force. Both forces balance each other and create a potential difference perpendicular to the direction of current flow. The potential difference can be measured as a Hall voltage and varies in a linear relationship with the magnetic field for small values. Hall effect sensors can be used for current sensing applications.

A signal processing circuit and/or a signal conditioning circuit may receive one or more signals (i.e., sensor signals) from one or more sensors in the form of raw measurement data and may derive, from the sensor signal, a measurement signal that represents the measured physical quantity. Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a signal suitable for processing after conditioning.

Thus, a signal processing circuit may include an analog-to-digital converter (ADC) that converts the analog signal from the one or more sensor elements to a digital signal. The signal processing circuit may also include a digital signal processor (DSP) that performs some processing on the digital signal.

A "power semiconductor device" as used herein may be a semiconductor device on one or more chips with high voltage blocking and/or high current-carrying capabilities. In other words, such power semiconductor device may be intended for high current, typically in the Ampere range, e.g., up to several ten or hundred Ampere, and/or high voltages, typically above 15 V, more typically 100 V and above.

Specific embodiments described in this specification pertain to, without being limited thereto, a power semiconductor device that may be used within a power converter or a power supply. Thus, in an embodiment, the power semiconductor device may be configured to carry a load current that is to be fed to a load and/or, respectively, that is provided by a power source. For example, the semiconductor device may comprise one or more active power semiconductor cells, such as a monolithically integrated diode cell, and/or a monolithically integrated transistor cell. Such diode cell and/or such transistor cells may be integrated in a power semiconductor module.

Power semiconductor devices including transistors which are suitably connected to form half-bridges are commonly used in the field of power electronics. For example, half-bridges may be used for driving electric motors or switched mode power supplies.

For example, a three-phase inverter is configured to provide three-phase power by supplying three phase loads (e.g., a three-phase motor). Three-phase power involves three symmetrical sine waves that are 120 electrical degrees out of phase with one another. In a symmetric three-phase power supply system, three conductors each carry an alternating current (AC) of the same frequency and voltage amplitude relative to a common reference but with a phase difference of one third the period. Due to the phase difference, the voltage on any conductor reaches its peak at one third of a cycle after one of the other conductors and one third of a cycle before the remaining conductor. This phase delay gives constant power transfer to a balanced linear load. It also makes it possible to produce a rotating magnetic field in an electric motor.

In a three-phase system feeding a balanced and linear load, the sum of the instantaneous currents of the three conductors is zero. In other words, the current in each conductor is equal in magnitude to the sum of the currents in the other two, but with the opposite sign. The return path for the current in any phase conductor is the other two phase conductors.

A three-phase inverter includes an three inverter legs, one for each of the three phases, and each inverter leg is connected to a direct current (DC) voltage source in parallel to each other. Each inverter leg includes a pair of transistors, for example, arranged in a half-bridge configuration for converting DC to AC. In other words, each inverter leg includes two complementary transistors connected in series and which switch on and off complementary to the each other for driving a phase load.

Transistors may include Insulated Gate Bipolar Transistors (IGBTs) and Metal Oxide Semiconductor Field Effect Transistors (MOSFETs) (e.g., Si MOSFETs or SiC MOSFETs). While IGBTs are used as an example in the embodiments below, it will be appreciated that MOSFETs may be substituted for the IGBTs. In this context, when substituting a MOSFET for an IGBT, a MOSFET's drain may be substituted for an IGBT's collector, the MOSFET's source may be substituted for the IGBT's emitter, and the MOSFETs drain-source voltage Vds may be substituted for the IGBT's collector-emitter voltage Vce in any one of the examples described herein. Thus, any IGBT module may be substituted by a MOSFET module and vice versa.

FIG. 1 is a schematic block diagram illustrating a motor control loop 100 of a power semiconductor device according to one or more embodiments. In particular, the motor control loop 100 includes a power inverter 1 and an inverter driver board 2. The motor control loop 100 is further coupled to a three-phase motor M, that includes three phases U, V, and W. The power inverter 1 is a three-phase current generator configured to provide three-phase power by supplying three phase currents to drive the motor M.

Deviations in both magnitude and phase may case a loss in power and torque in the motor M. Therefore, the motor control loop 100 is configured to monitor and control the magnitude and phase of the currents supplied to the motor M to ensure the proper current balance is maintained.

The power inverter 1 includes six IGBT modules $3u_1$, $3u_2$, $3v_1$, $3v_2$, $3w_1$, and $3w_2$ (collectively referred to as IGBT modules 3) arranged in complementary pairs. Each complementary pair constitutes one inverter leg that supplies a phase current to the three-phase motor M. Thus, each inverter leg includes an upper IGBT module 3 and a lower IGBT module. Each IGBT module includes one IGBT 4 and one diode 5. Thus, each inverter leg includes an upper IGBT 4 and a lower IGBT 4. Load current paths U, V and W extend from an output of each inverter leg (i.e., the output of each half-bridge) located between complementary IGBTs and are configured to be coupled to a load, such as motor M. The power inverter 1 is coupled to a DC power supply 6 (e.g., a battery) and to the inverter driver board 2.

The inverter driver board 2 includes a driver unit 7 which generates driver signals for controlling the IGBT 4 of each IGBT module 3. Thus, load current paths U, V, and W may be controlled by the driver unit 7 by means of controlling the control electrodes, sometimes referred to as gate electrodes, of the IGBTs 4. For example, upon receiving a corresponding control signal from the diver unit 7, a control electrode may set the corresponding IGBT 4 in one of a conducting state (i.e., on-state) or a blocking state (i.e., off-state).

The inverter driver board 2 also includes a dv/dt detection circuit 8 that is coupled to a collector and an emitter of one or more of the IGBTs 4. In FIG. 1, the dv/dt detection circuit 8 is coupled to a collector and an emitter of each IGBT 4. The dv/dt detection circuit 8 is configured to measure a voltage transit slope dv/dt of each IGBT 4, and send the measurement result to a processing unit 9, which may be a computer, one or more processors, or other processing device, and may include a microcontroller and/or a digital signal processor (DSP).

Measuring the voltage transit slope dv/dt of an IGBT 4 enables the processing unit 9 to determine a junction temperature Tj of the IGBT 4 in real-time. Thus, for each IGBT 4, for which a voltage transit slope dv/dt is measured, a junction temperature Tj thereof may be determined. As will be described in further detail below, the voltage transit slope dv/dt is measured during a turn-off period while the IGBT 4 is turned off.

The DC power supply might float during operation. Therefore, in addition to receiving a measurement of a voltage transit slope dv/dt of each IGBT 4, the processing unit 9 may also receive a measured voltage Vdc of the DC power supply 6 (i.e., at the DC link), which is measured by a DC voltage sensor 10 coupled to the DC link. The voltage Vdc may be measured, for example, at the time a corresponding IGBT 4 (i.e., an IGBT 4 whose junction temperature Tj is being determined) is turned off, or at a time just prior to turning off the corresponding IGBT 4. That is, voltage Vdc may be measured when the corresponding IGBT 4 is triggered to turn off at its control electrode.

In addition, the motor control loop 100 includes current sensors $11u$, $11v$, and $11w$ (collectively referred to as current sensors 11), each one provided in a different load current path U, V, and W. The current sensors 11 may be Hall sensors which measure a magnetic field that is proportional to a current flowing in a load current path, or any other type of current probe.

Each current sensor 11 is configured to measure a load current flowing in its corresponding load current path U, V, and W, and provide a current measurement value to the processing unit 9. A load current I_load for a corresponding IGBT 4 (i.e., an IGBT 4 whose junction temperature Tj is being determined) may be measured at the time the corresponding IGBT 4 is turned off. That is, the load current I_load may be measured when the corresponding IGBT 4 is triggered to turn off at its control electrode.

In view of the above, the processing unit 9 receives a voltage transit slope dv/dt of an IGBT 4 (i.e., measured during a turn-off period) from the dv/dt detection circuit 8, a voltage Vdc from the DC voltage sensor 10, and a current measurement corresponding to the load current I_load of the IGBT 4 (i.e., measured at turn-off of the IGBT 4). Additionally, the processing unit 9 includes or is coupled to a memory that stores a lookup table that includes a correlation of dv/dt and Tj, as well as to voltage Vdc and load current I_load. Thus, the processing unit 9 is configured to determine the junction temperature Tj of an IGBT 4 by reading it from the table based on the received inputs. In addition, the processing unit 9 may further output or indicating the determined junction temperature Tj via a display, or by issuing a warning, such as a light, alarm, or other indicator that represents a possible fault in the IGBT module. For example, a processing unit 9 may compare the determined junction temperature Tj with a normal junction temperature Tj range or threshold, and issue a warning if the determined junction temperature Tj exceeds the range or threshold.

FIG. 2 shows a look-up table 200 according to one or more embodiments. Each row of the look-up table 200 includes various dv/dt measurements at a current level I_load measured at turn-off of the corresponding IGBT 4. Each dv/dt measurement at a certain current level I_load corresponds to a junction temperature Tj of the corresponding IGBT 4. Thus, by determining the load current at turn-off and the voltage transit slope dv/dt during a turn-off period, the junction temperature Tj for the corresponding IGBT 4 can be determined via the look-up table 200. If dv/dt is detected at 1300 V/us and load current at 30 A, then according to look-up 200, the junction temperature Tj is 50 C.

In particular, a transistor's (e.g., IGBT's or MOSFET's) voltage transit slope dv/dt during a turn-off period is proportional to junction temperature Tj at a certain current and voltage level. Dv/dt decreases almost linearly with junction temperature Tj at a serial rate of loading current. Since dv/dt depends on current and voltage level, the look-up table can be generated during testing of the IGBT 4 (e.g., during design or production) by measuring the value of dv/dt at several temperature points, current levels, and voltage levels. For example, at a design stage of a power stack, the IGBT module can be heated up by a heat plate or other heating means. At each temperature point (of various temperature points), dv/dt is measured at several current levels by double pulse switching. Then a look-up table may be created therefrom. A different look-up table may be created for different voltage levels.

Thus, the processing unit 9 may first select a look-up table from multiple look-up tables based on Vdc, and then determine the junction temperature Tj via a correlation between dv/dt and load current I_load stored in the selected table.

FIG. 3 shows a collection of look-up tables 301, 302, . . . for an IGBT according to one or more embodiments. Each IGBT 4 may have its own collection of look-up tables. Each look-up table 301, 302, . . . corresponds to a voltage level (e.g., 600V, 550V, . . . ) of Vdc measured, for example, at turn-off of the corresponding IGBT 4. Thus, the processing unit 9 may select one of the tables based on the measured voltage Vdc, and then proceed to determine the junction temperature Tj in the manner described above in FIG. 2 based on dv/dt and I_load.

In particular, "at turn-off" may be a time at which a turn-off signal (i.e., a control signal) is triggered or is sent by the driver unit 7 to turn off a corresponding IGBT 4 (i.e., the corresponding transistor). Thus, the processing unit 9 may read the sensor values from the current sensor 11 and the voltage sensor 10 at the time the turn-off signal is transmitted.

Intervals between temperatures, currents, and voltages for the look-up tables may be adjusted according to design choice and is not limited to those shown in the tables. For example, in practical applications, a 25° C. temperature gap may not be acceptable. Thus, the temperature interval of 5° C. and a current interval of 10A may be used to achieve more precise and granular junction temperature Tj determinations. In addition, a look-up table may be generated at 10V intervals instead of at the 50V intervals shown in FIG. 3.

Figure 4:
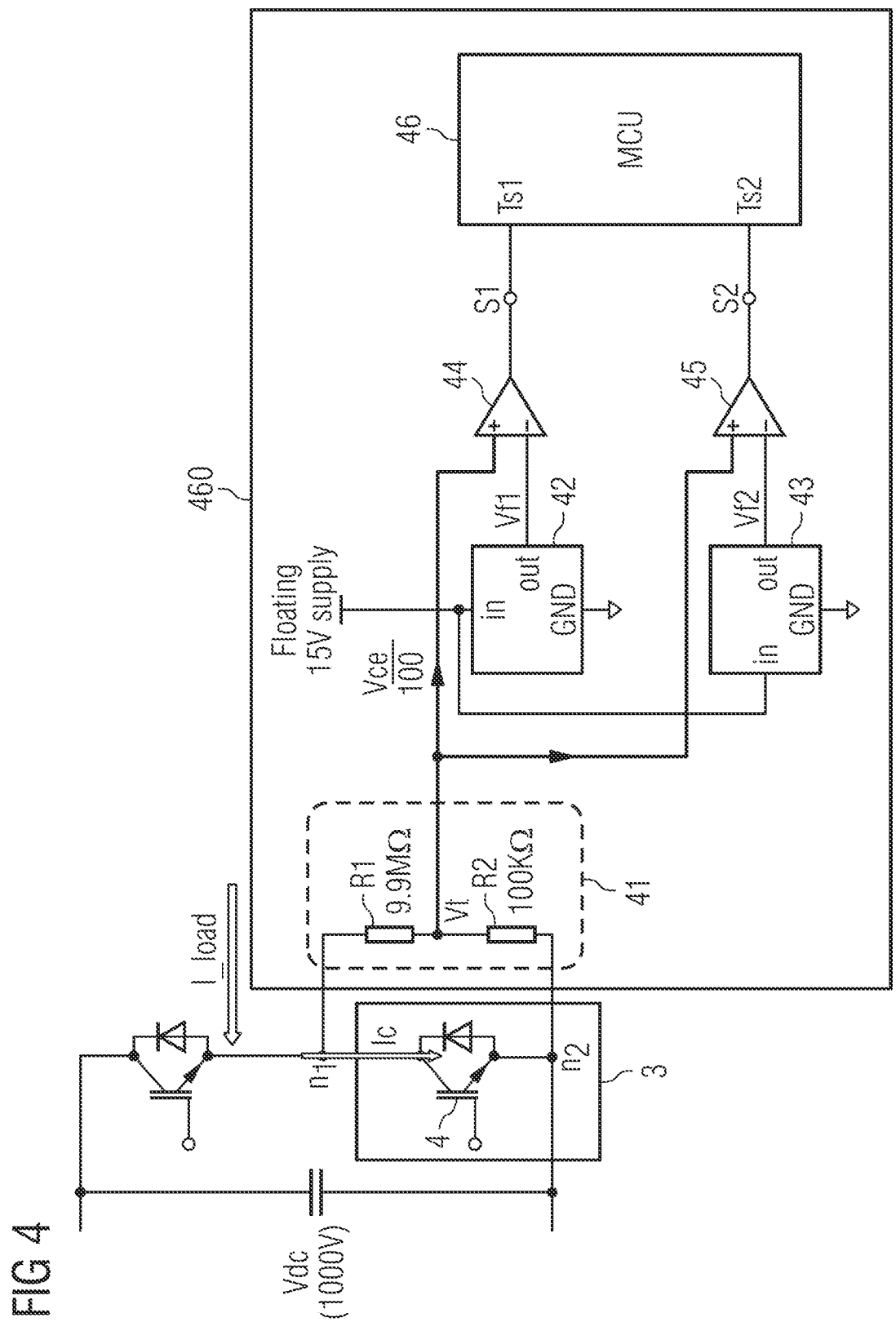
FIG. 4 is schematic diagram of a voltage transit slope dv/dt detection circuit coupled to a lower IGBT module according to one or more embodiments.

FIG. 4 is schematic diagram of a voltage transit slope dv/dt detection circuit 400 coupled to a lower (low-side) IGBT module 3 according to one or more embodiments. The voltage transit slope dv/dt detection circuit 400 is configured to measure dv/dt during a turn-off period of the IGBT 4 in the lower IGBT module 3. While the low-side IGBT 4 is turned on, load current I_load flows through the IGBT 4 from the load, and the collector-emitter voltage Vce of the IGBT 4 is at a zero. When the IGBT 4 is turned off, the collector current Ic of the IGBT 4 decreases to zero over time, and Vce of the IGBT 4 increases over time to the DC bus voltage Vdc. Thus, at turn-off of the IGBT 4, the load current I_load is measured by a current sensor (not shown) to determine the current value used for the look up of the junction temperature Tj. Furthermore, once the IGBT 4 is turned off, dv/dt can be determined by the dv/dt detection circuit 400 over a turn-off period.

The voltage transit slope dv/dt detection circuit 400 includes a voltage divider 41 provided in parallel to the IGBT 4, with a first node n1 coupled to the collector of the IGBT 4 and a second node n2 couple to the emitter of the IGBT 4 and to a ground potential. Thus, the voltage across the voltage divider 41 is the collector-emitter voltage Vce of the IGBT 4. Based on the example values of the resistors R1 and R2 used in the voltage divider 41, the output voltage Vt of the voltage divider 41 is Vce/100. When the IGBT 4 is turned off, the voltage across it (i.e., Vce) increases during the turn off period. That is, Vce increases over time. Since, voltage transit slope dv/dt during this turn off period is proportional to junction temperature Tj, dv/dt can be measured and used to determine the junction temperature Tj.

The voltage transit slope dv/dt detection circuit 400 further includes two reference voltage generators 42 and 43 configured to generate a respective reference voltage Vf1 and Vf2 (e.g., 8V and 2V, respectively). In this example, dv/dt is defined as (80% Vce–20% Vce)/dt at nominal voltage. Here, the voltage divider (i.e., 1/100) and the reference voltages Vf1 and Vf2 (e.g., 8V and 2V) define dv to be 600V (i.e., dv=(0.8%–0.2%)Vce*100=600V). That is, the dv/dt detection circuit 400 is configured to monitor a change in voltage of 600V across Vce. To achieve this voltage range of 80% Vce–20% Vce, in this example, reference voltages Vf1 and Vf2 are set at 8V and 2V, respectively, and the reference voltages Vf1 and Vf2 are compared to the output voltage Vt of the voltage divider 41.

However, the voltage range is not necessarily tied directly to a specific percentage of Vce, as the actual percentage of Vce may change based on the value of Vdc. Thus, a microcontroller unit (MCU) 46 may receive a measurement of the DC voltage Vdc from the voltage sensor 10 (e.g., at turn-off of the IGBT 4), and adjust the reference voltages Vf1 and Vf2 at the reference voltage generators 42 and 43 based on the measured DC voltage Vdc. For example, the MCU 46 may control the reference voltage generators 42 and 43 to adjust the reference voltages Vf1 and Vf2 such that the voltage range is approximately 80% Vdc to 20% Vdc, or some other predefined voltage range of Vdc.

Each reference voltage generator 42 and 43 is coupled to a comparator 44 and 45, respectively. Comparator 44 receives the output voltage Vt of the voltage divider 41 at its positive input terminal V+ and receives the reference voltage Vf1 at is negative input terminal V1, and outputs a binary output value S1 based on the comparison result. Specifically, the output value S1 is a logic high value (e.g., 1) when Vt is greater than Vf1 and is a logic low value (e.g., 0) when Vt is less than Vf1.

Similarly, comparator 45 receives the output voltage Vt of the voltage divider 41 at its positive input terminal V+ and receives the reference voltage Vf1 at is negative input terminal V1, and outputs a binary output value S2 based on the comparison result. Specifically, the output value S2 is a logic high value (e.g., 1) when Vt is greater than Vf1 and is a logic low value (e.g., 0) when Vt is less than Vf1.

The comparator results S1 and S2 are output from each comparator 44 and 45 to the MCU 46. The MCU 46 captures a time Ts1 when the value of S1 changes in value (e.g., from logic low to logic high), indicating that Vce has risen above reference voltage Vf1. Similarly, the MCU 46 captures a time Ts2 when the value of S2 changes in value (e.g., from logic low to logic high), indicating that Vce has risen above reference voltage Vf2. Thus, two time values Ts1 and Ts2 are determined by the MCU 46 representing the time period dt it took for Vce to change from reference voltage Vf2 to reference voltage Vf1. That is, the time period dt it took for Vt (i.e., Vce/100) to increase 6V (i.e., dv) according to this example. Accordingly, the change in time dt of the voltage transit slope dv/dt is equal to Ts1-Ts2.

Hence, by knowing the voltage range dv and determining the changed in time dt, the voltage transit slope dv/dt can be determined by the dv/dt detection circuit 400 (e.g., by the MCU 46) and output to the processing unit 9 for determining the junction temperature Tj of the IGBT 4.

The MCU 46 may also be configured to trigger various measurements in the system and receive those measurements in order to pass them along to the processing unit 9. For example, the MCU 46 is configured to determine the voltage transit slope dv/dt during a turn-off period and transmit the measurement to the processing unit 9. Furthermore, the MCU 46 may read a measurement of the respective load current I_load from a current sensor 11 at turn-off of the IGBT 4, and transmit the measurement to the processing unit 9. In addition, the MCU 46 may read a measurement of the DC voltage Vdc from a voltage sensor 10 at turn-off of the IGBT 4, receive the measurement, and transmit the measurement to the processing unit 9. In particular, "at turn-off" may be a time at which a turn-off signal (i.e., a control signal) is triggered or is sent by the driver unit 7 to turn off a corresponding IGBT 4 (or transistor). Thus, the MCU 46 may read the sensor values from the current sensor 11 and the voltage sensor 10 at the time the turn-off signal is transmitted.

Figure 5:
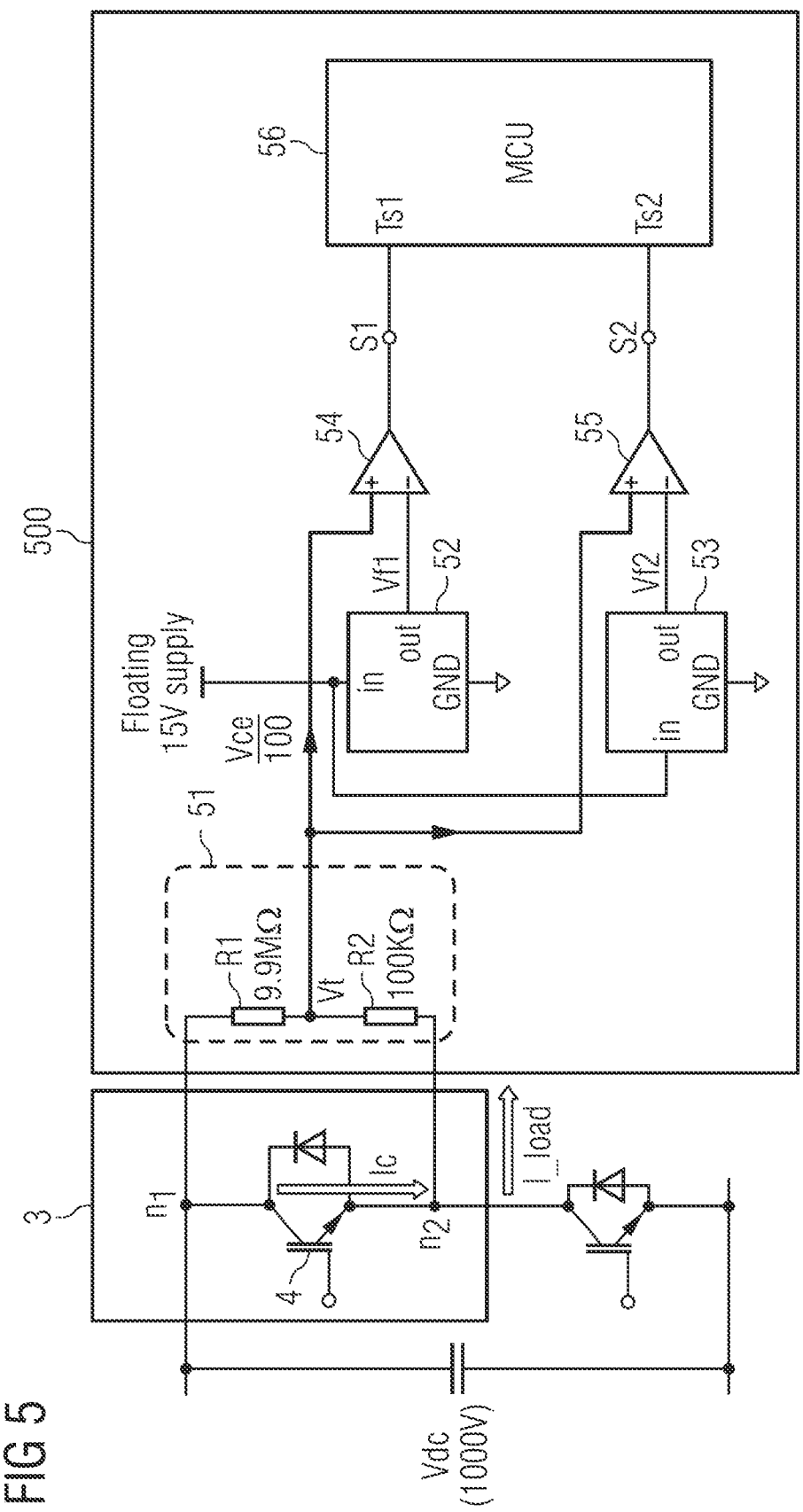
FIG. 5 is schematic diagram of a voltage transit slope dv/dt detection circuit coupled to an upper IGBT module according to one or more embodiments.

FIG. 5 is schematic diagram of a voltage transit slope dv/dt detection circuit 500 coupled to an upper (high-side) IGBT module 3 according to one or more embodiments. The voltage transit slope dv/dt detection circuit 500 is similar to the voltage transit slope dv/dt detection circuit 400 shown in FIG. 4, with the exception that a voltage divider 51 straddles the upper IGBT as opposed to the lower IGBT. While the high-side IGBT 4 is turned on, load current I_load flows through the IGBT 4 towards the load, and the collector-emitter voltage Vce of the IGBT 4 is at a zero. When the IGBT 4 is turned off, the collector current Ic of the IGBT 4 decreases to zero over time, and Vce of the IGBT 4 increases over time to the DC bus voltage Vdc. Thus, at turn-off of the IGBT 4, the load current I_load is measured by a current sensor (not shown) to determine the current value used for the look up of the junction temperature Tj. Furthermore, once the IGBT 4 is turned off, dv/dt can be determined by the dv/dt detection circuit 500 over a turn-off period.

The voltage transit slope dv/dt detection circuit 500 includes a voltage divider 51, two reference voltage generators 52 and 53, two comparators 54 and 55, and an MCU 56. The MCU 56 is configured to determine the voltage transit slope dv/dt based on similar principles described above in FIG. 4 which will not be repeated.

In view of FIGS. 4 and 5, each IGBT module 3 shown in FIG. 1 may be coupled to a different dv/dt detection circuit having one of the configurations shown in FIG. 4 or FIG. 5 for determining the voltage transit slope dv/dt thereof. Each dv/dt detection circuit may include its own MCU or may share a single MCU with other dv/dt detection circuits.

Figure 6:
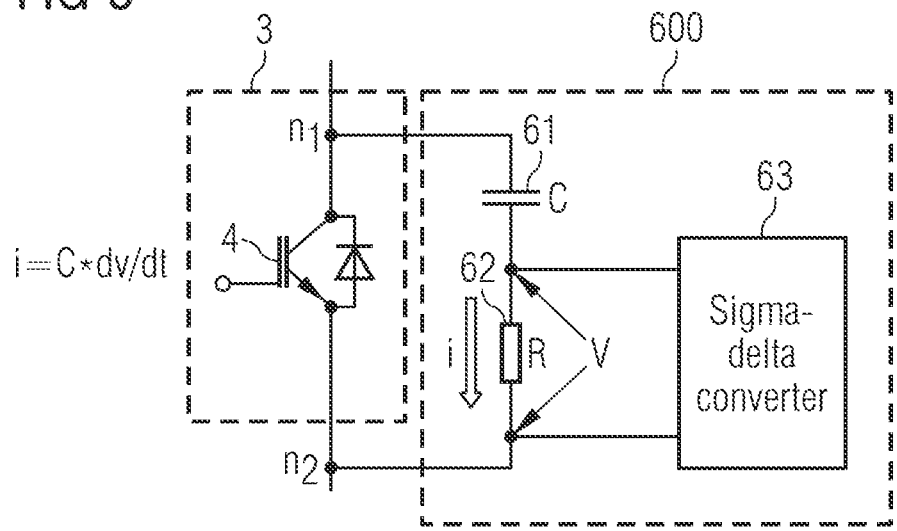
FIG. 6 is schematic diagram of a voltage transit slope dv/dt detection circuit coupled to an IGBT module according to one or more embodiments.

FIG. 6 is schematic diagram of a voltage transit slope dv/dt detection circuit 600 coupled to an IGBT module 3 according to one or more embodiments. Specifically, the voltage transit slope dv/dt detection circuit 600 may be coupled to any of the IGBT modules 3 shown in FIG. 1 for determining the voltage transit slope dv/dt thereof during a turn off period. The voltage transit slope dv/dt detection circuit 600 includes a capacitor 61 connected in series with a shunt resistor 62. The dv/dt detection circuit 600 further includes a sigma-delta converter 63 that measures a voltage V across the shunt resistor 62 and determines dv/dt. Similar to the voltage transit slope dv/dt detection circuits 400 and 500, the voltage in the dv/dt detection circuit increases during a turn-off period since Vce increases over time to Vdc during the turn-off period. A current i flowing through the shunt resistor 62, which increases over the turn-off period, can be obtained by I=V/R, and then dv/dt can be calculated by dv/dt=I/C.

Figure 7:
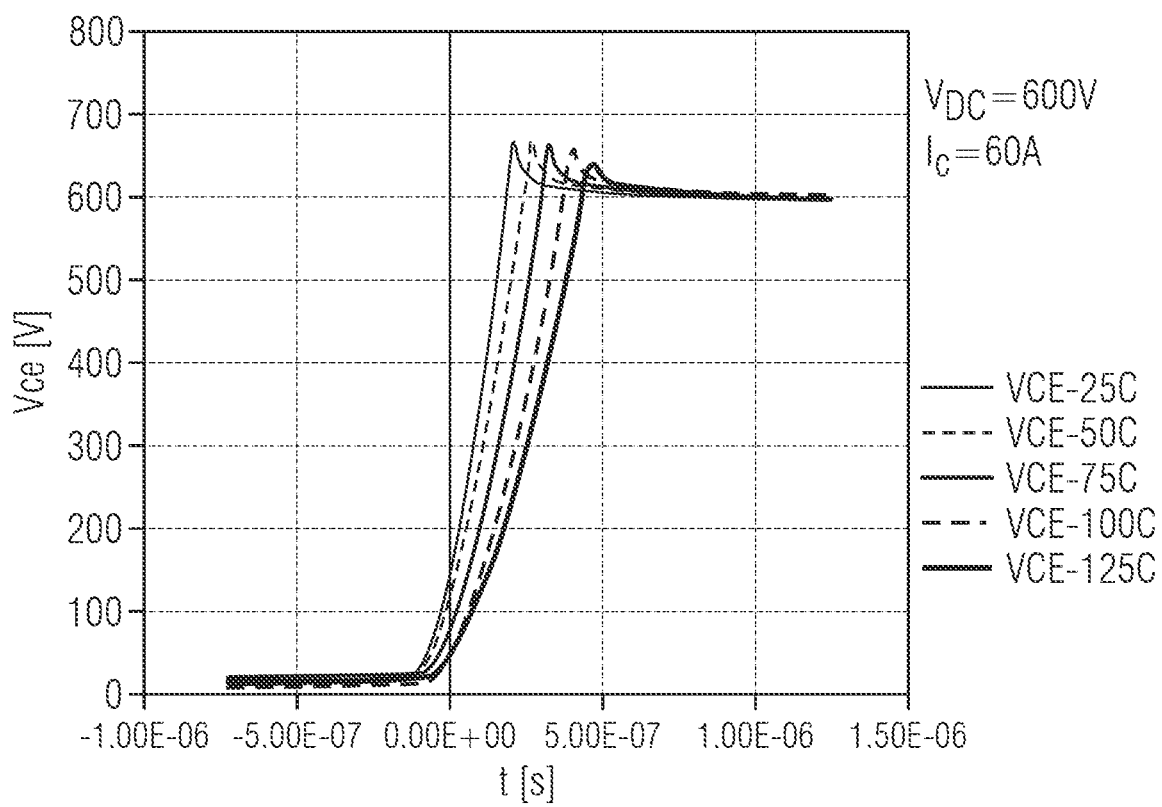
FIG. 7 shows a graph illustrating that the voltage slew rate of Vce decreases as junction temperature increases according to one or more embodiments.

FIG. 7 shows a graph illustrating that the voltage slew rate of Vce decreases as junction temperature increases.

Figure 8:
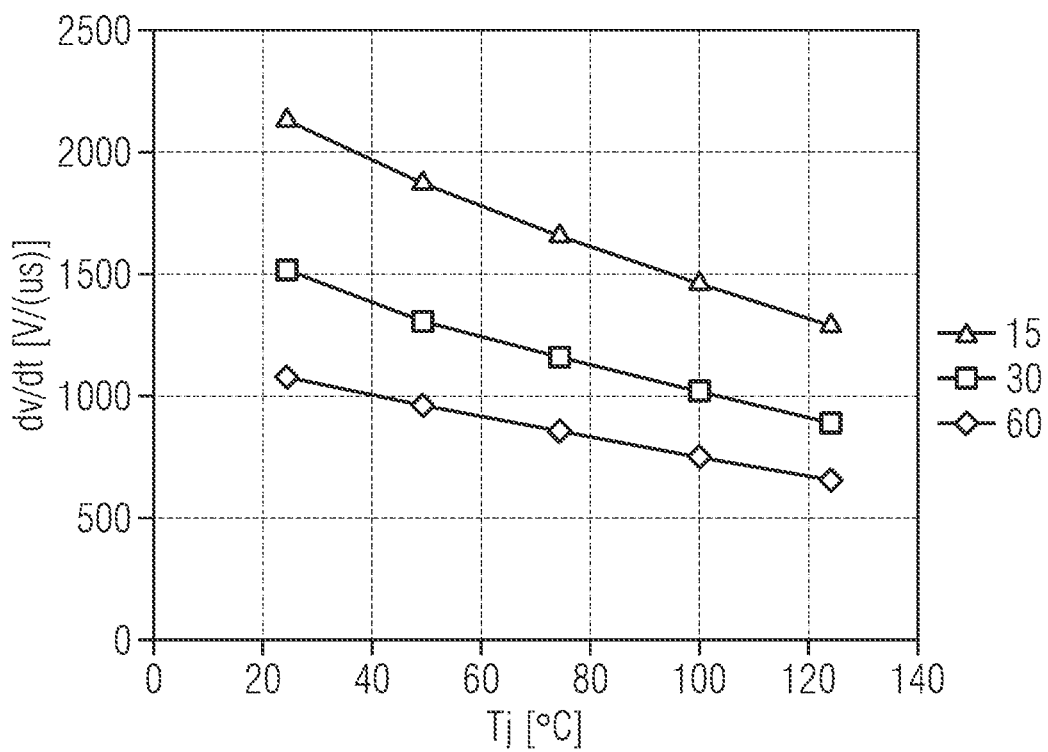
FIG. 8 shows a graph illustrating that voltage transit slope dv/dt decreases almost linearly with junction temperature Tj at a serial rate of loading current I_load according to one or more embodiments.

FIG. 8 shows a graph illustrating that dv/dt decreases almost linearly with junction temperature Tj at a serial rate of loading current I_load.

Figure 9:
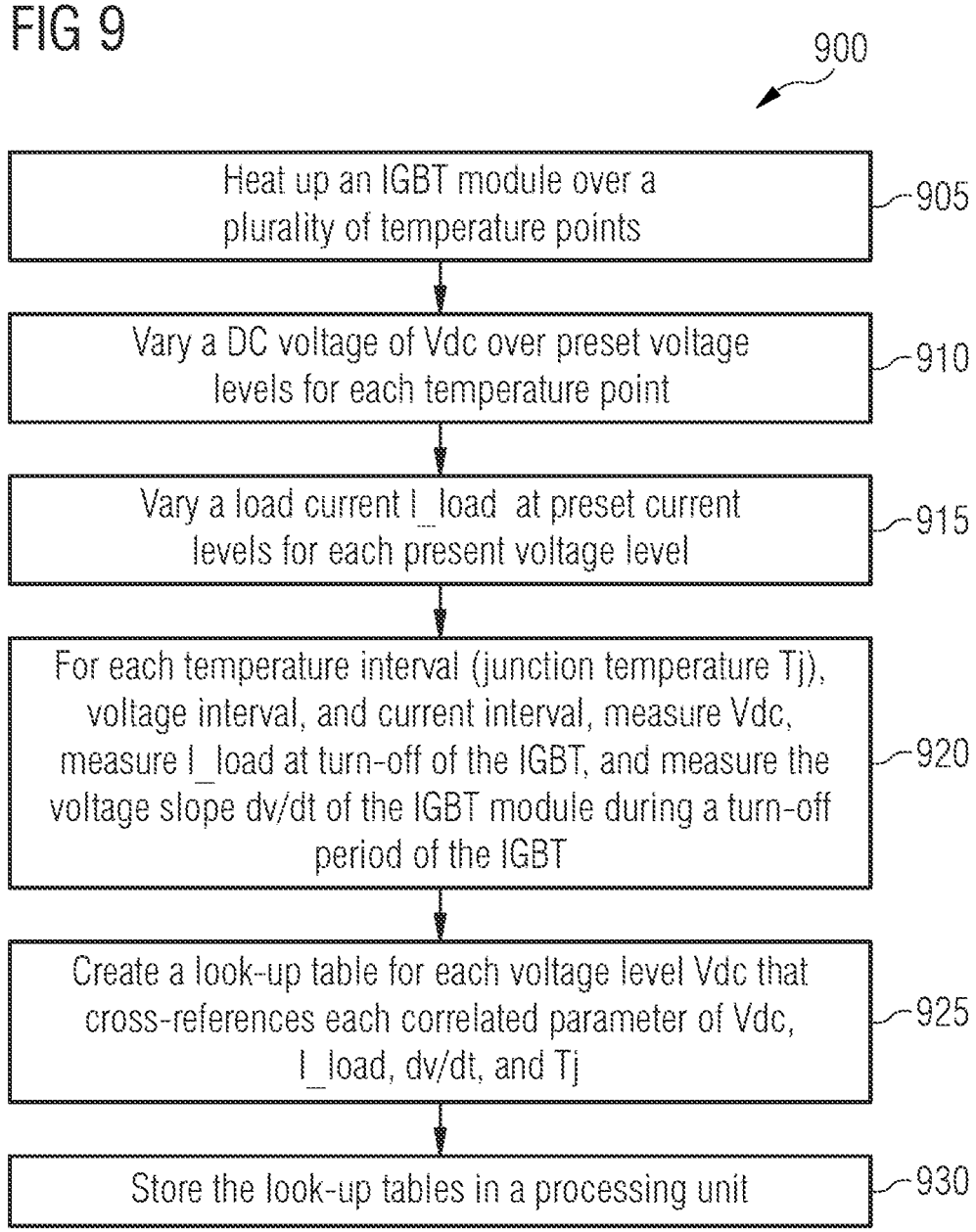
FIG. 9 is a flow diagram illustrating a look-up table generating process according to one or more embodiments.

FIG. 9 is a flow diagram illustrating a look-up table generating process 900 according to one or more embodiments. As indicated above, IGBT voltage transit slope dv/dt during a turn-off period is proportional to junction temperature Tj at a certain current level and voltage level. Thus, at a testing phase of a design stage of an IGBT module, a look-up table or a series of look-up tables can be created for use in a real-time look up procedure during operation of the IGBT module.

The look-up table generating process 900 includes heating up an IGBT module over a plurality of temperature points are representative of the junction temperature Tj of the IGBT module (operation 905). At each temperature point vary a DC voltage of Vdc such that Vdc is set at a plurality of voltage levels (operation 910). At each voltage level, vary a load current I_load that flows through the IGBT module such that I_load is set at a plurality of current levels (operation 915). For each temperature interval (junction temperature Tj), voltage interval, and current interval, measure Vdc (e.g., at turn-off of the IGBT), measure I_load at turn-off of the IGBT, and measure the voltage transit slope dv/dt of the IGBT module by double pulse switching during a turn-off period of the IGBT (operation 920). Create a look-up table for each voltage level Vdc that cross-references each correlated parameter of Vdc, I_load, dv/dt, and Tj (operation 925). Store the look-up tables in a processing unit (operation 930).

Figure 10:
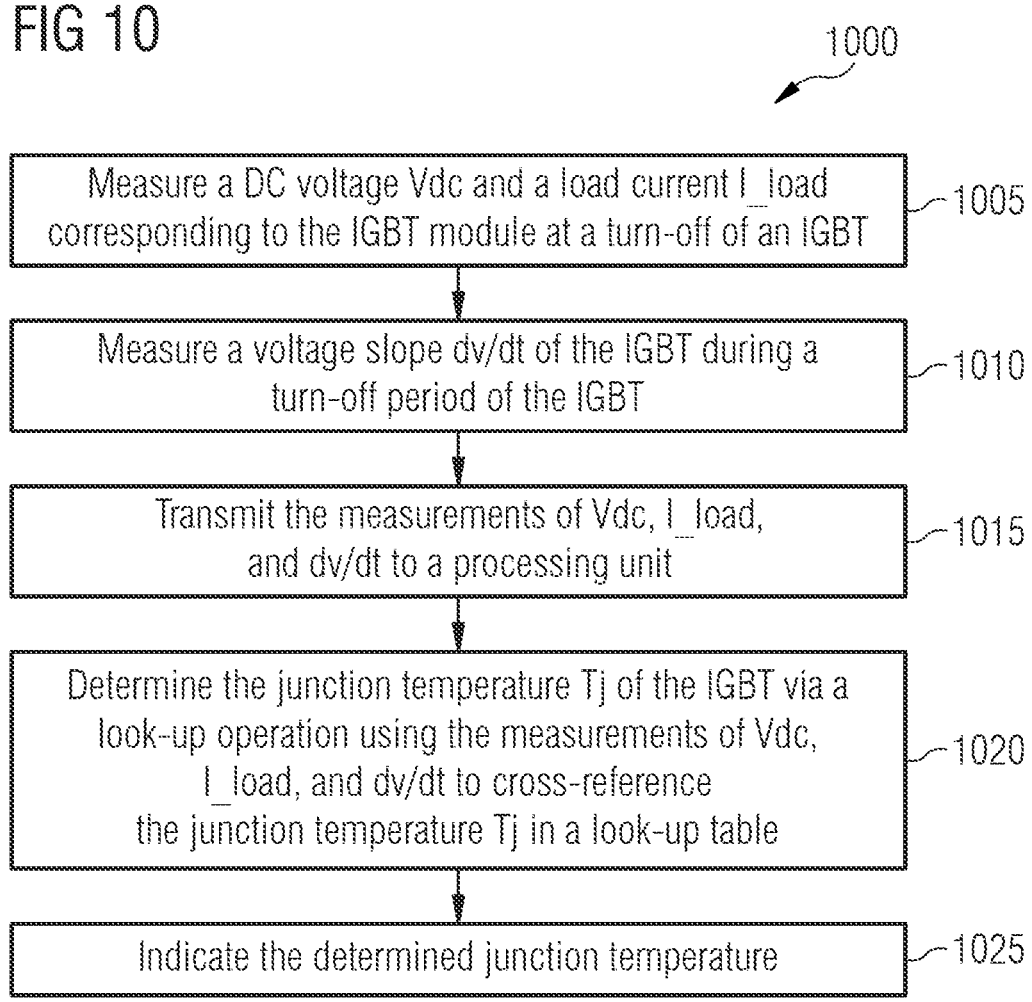
FIG. 10 is a flow diagram illustrating a process of determining junction temperature Tj while an IGBT module is operating according to one or more embodiments.

FIG. 10 is a flow diagram illustrating a process 1000 of determining junction temperature Tj while an IGBT module is operating according to one or more embodiments. The process 1000 includes measuring a DC voltage Vdc and a load current I_load corresponding to the IGBT module at a turn-off of the IGBT (i.e., at the moment the IGBT in the IGBT module is turned-off) (operation 1005), and measure a voltage transit slope dv/dt of the IGBT during a turn-off period of the IGBT (operation 1010). Transmit the measurements of Vdc, I_load, and dv/dt to a processing unit (operation 1015), and determine the junction temperature Tj of the IGBT via a look-up operation using the measurements of Vdc, I_load, and dv/dt to cross-reference the junction temperature Tj in a look-up table (operation 1020). The process may further includes outputting or indicating the determined junction temperature Tj via a display, or by issuing a warning, such as a light, alarm, or other indicator that represents a possible fault in the IGBT module. For example, a processing unit may compare the determined junction temperature Tj with a normal junction temperature Tj range or threshold, and issue a warning if the determined junction temperature Tj exceeds the range or threshold.

In view of the above, the system provides real-time, direct measurements of an IGBT junction temperature while an IGBT is in operation (i.e., while the power inverter is in operation).

Figure 11:
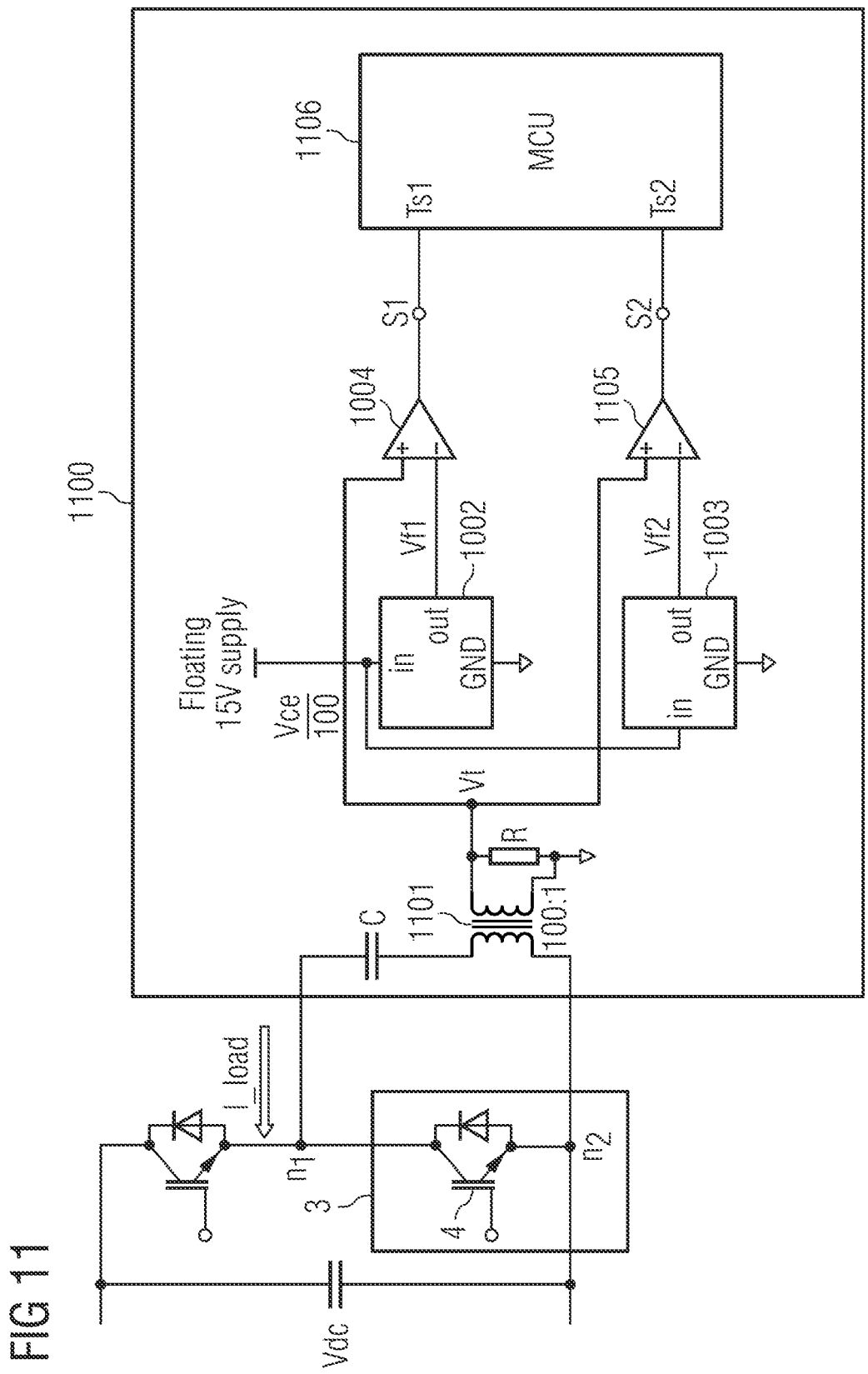
FIG. 11 is schematic diagram of a voltage transit slope dv/dt detection circuit coupled to an IGBT module according to one or more embodiments.

FIG. 11 is schematic diagram of a voltage transit slope dv/dt detection circuit 1100 coupled to an IGBT module 3 according to one or more embodiments. Specifically, the voltage transit slope dv/dt detection circuit 1100 may be coupled to any of the IGBT modules 3 shown in FIG. 1 for determining the voltage transit slope dv/dt thereof during a turn off period. Here, the voltage transit slope dv/dt detection circuit 1100 is shown coupled to a low-side IGBT module 3. The voltage transit slope dv/dt detection circuit 1100 includes a transformer 1101 to transfer DC voltage to one percent such that it is converted to voltage Vt.

With the exception of using the transformer 1101 to convert Vce to Vt, the voltage transit slope dv/dt detection circuit 1100 is similar to the voltage transit slope dv/dt detection circuit 400 shown in FIG. 4. For example, the voltage transit slope dv/dt detection circuit 1100 includes two reference voltage generators 1102 and 1103, two comparators 1104 and 1105, and an MCU 1106. The MCU 1106 is configured to determine the voltage transit slope dv/dt based on similar principles described above in FIG. 4 which will not be repeated.

While various embodiments have been described, it will be apparent to those of ordinary skill in the art that many more embodiments and implementations are possible within the scope of the disclosure. For example, there may be other ways to generate voltage Vt other than using a voltage divider, as in FIGS. 4 and 5, or a transformer, as in FIG. 11. Accordingly, the invention is not to be restricted except in light of the attached claims and their equivalents. With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure. Such hardware, software, and firmware may be implemented within the same device or within separate devices to support the various techniques described in this disclosure.

Although various exemplary embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. A system configured to measure a junction temperature of a transistor, the system comprising:
 a power inverter configured to supply power to a load, the power inverter including the transistor that is configured to switch between an on-state and an off-state and generate a load current during the on-state;
 a current sensor configured to measure the load current;
 a voltage transit slope detection circuit configured to determine a voltage transit slope corresponding to a voltage across the transistor during a turn-off period of the transistor during which the transistor is in the off-state; and
 a processing unit configured to determine the junction temperature of the transistor based on the measured load current and the determined voltage transit slope.

2. The system of claim 1, wherein:
 the current sensor is configured to measure the load current at a turn-off time of the transistor, the turn-off time being when the transistor switches from the on-state to the off-state.

3. The system of claim 1, wherein:
 the processing unit is configured to store a look-up table that includes a plurality of load current values, wherein each of the plurality of load current values is correlated to a different plurality of voltage transit slope values, and each load current value-voltage transit slope value combination is correlated to one of a plurality of junction temperatures, and
 the processing unit is configured to determine the junction temperature of the transistor from the look-up table based on the measured load current and the determined voltage transit slope.

4. The system of claim 1, further comprising:
 a direct current (DC) voltage source coupled to the power inverter; and
 a voltage sensor configured to measure a DC voltage of the DC voltage source, wherein the processing unit is configured to determine the junction temperature of the transistor based on the measured load current, the determined voltage transit slope, and the measured DC voltage.

5. The system of claim 4, wherein:
the voltage sensor is configured to measure the DC voltage at a turn-off time of the transistor, the turn-off time being when the transistor switches from the on-state to the off-state.

6. The system of claim 4, wherein:
the processing unit is configured to store a plurality of look-up tables each corresponding to one of a plurality of different DC voltage values, wherein each look-up table of the plurality of look-up tables includes a plurality of load current values, wherein each of the plurality of load current values is correlated to a different plurality of voltage transit slope values, and each load current value-voltage transit slope value combination is correlated to one of a plurality of junction temperatures, and
the processing unit is configured to select a look-up table from the plurality of look-up tables based on the measured DC voltage, and determine the junction temperature of the transistor from the selected look-up table based on the measured load current and the determined voltage transit slope.

7. The system of claim 1, wherein:
the voltage transit slope represents a change in the voltage across the transistor, over a predetermined voltage range defined by a first voltage and a second voltage, over a time period for which the voltage across the transistor changes from the first voltage to the second voltage during the turn-off period.

8. The system of claim 7, further comprising:
a direct current (DC) voltage source coupled to the power inverter; and
a voltage sensor configured to measure a DC voltage of the DC voltage source,
wherein the voltage transit slope detection circuit is configured to adjust the predetermined voltage range based on the measured DC voltage.

9. The system of claim 1, wherein the voltage transit slope detection circuit comprises:
a voltage divider with a first node coupled to a collector electrode of the transistor and a second node coupled to the emitter electrode of the transistor; and
a processor configured to determine a time period for which the voltage across the transistor changes from a first voltage to a second voltage during the turn-off period and determine the voltage transit slope based on the determined time period.

10. The system of claim 1, wherein the voltage transit slope detection circuit comprises:
a capacitor connected to a first electrode of the transistor;
a shunt resistor connected in series with the capacitor and further connected to a second electrode of the transistor; and
a sigma-delta converter configured to measure a voltage drop across the shunt resistor and determine the voltage transit slope based on the measured voltage drop and a capacitance of the capacitor.

11. A method of measuring a junction temperature of a transistor, the method comprising:
switching the transistor between an on-state and an off-state to convert a direct current (DC) voltage to an alternating current (AC) voltage;
generating a load current during the on-state of the transistor;
measuring the load current;
determining a voltage transit slope corresponding to a voltage across the transistor during a turn-off period of the transistor during which the transistor is in the off-state; and
determining the junction temperature of the transistor based on the measured load current and the determined voltage transit slope.

12. The method of claim 11, wherein:
measuring the load current includes measuring the load current at a turn-off time of the transistor, the turn-off time being when the transistor switches from the on-state to the off-state.

13. The method of claim 11, further comprising:
storing a look-up table that includes a plurality of load current values, wherein each of the plurality of load current values is correlated to a different plurality of voltage transit slope values, and each load current value-voltage transit slope value combination is correlated to one of a plurality of junction temperatures; and
determining the junction temperature of the transistor from the look-up table based on the measured load current and the determined voltage transit slope.

14. The method of claim 11, further comprising:
measuring a DC voltage of a DC voltage source; and
determining the junction temperature of the transistor based on the measured load current, the determined voltage transit slope, and the measured DC voltage.

15. The method of claim 14, wherein:
measuring the DC voltage includes measuring the DC voltage at a turn-off time of the transistor, the turn-off time being when the transistor switches from the on-state to the off-state.

16. The method of claim 14, further comprising:
storing a plurality of look-up tables each corresponding to one of a plurality of different DC voltage values, wherein each look-up table of the plurality of look-up tables includes a plurality of load current values, wherein each of the plurality of load current values is correlated to a different plurality of voltage transit slope values, and each load current value-voltage transit slope value combination is correlated to one of a plurality of junction temperatures;
selecting a look-up table from the plurality of look-up tables based on the measured DC voltage; and
determining the junction temperature of the transistor from the selected look-up table based on the measured load current and the determined voltage transit slope.

17. The method of claim 11, wherein:
the voltage transit slope represents a change in the voltage across the transistor, over a predetermined voltage range defined by a first voltage and a second voltage, over a time period for which the voltage across the transistor changes from the first voltage to the second voltage during the turn-off period.

18. The method of claim 17, further comprising:
measuring a DC voltage of a DC voltage source; and
determining the junction temperature of the transistor based on the measured load current, the determined voltage transit slope, and the measured DC voltage; and
adjusting the predetermined voltage range based on the measured DC voltage.

19. The method of claim 11, wherein:
determining the voltage transit slope includes determining a time period for which the voltage across the transistor changes from a first voltage to a second voltage during the turn-off period and determining the voltage transit slope based on the determined time period and a voltage range defined by the first voltage and the second voltage.

20. The method of claim 11, wherein the voltage transit slope detection circuit comprises:
   measuring a voltage drop across a shunt resistor connected in series with a capacitor, wherein the capacitor is connected to a first electrode of the transistor and the shunt resistor is connected to a second electrode of the transistor; and
   determining the voltage transit slope based on the measured voltage drop and a capacitance of the capacitor.

* * * * *